(12) United States Patent
Dai et al.

(10) Patent No.: US 8,609,454 B2
(45) Date of Patent: Dec. 17, 2013

(54) SELF-ASSEMBLY APPARATUS, DEVICE SELF-ASSEMBLING METHOD, AND METHOD OF ASSEMBLING THERMOELECTRIC DEVICES

(75) Inventors: Ming-Ji Dai, Hsinchu (TW); Chun-Kai Liu, Taipei (TW); Heng-Chieh Chien, New Taipei (TW); Li-Ling Liao, Changhua County (TW); Ker-Win Wang, Taipei (TW); Yen-Lin Tzeng, Nantou County (TW); Yan-Bo Lin, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/551,606

(22) Filed: Jul. 17, 2012

(65) Prior Publication Data

US 2013/0302935 A1 Nov. 14, 2013

(30) Foreign Application Priority Data

May 10, 2012 (TW) .............................. 101116702 A (51) Int. Cl.
 *H01L 21/00* (2006.01)
(52) U.S. Cl.
 USPC ........ 438/64; 438/120; 257/E21.518; 29/739; 29/744
(58) Field of Classification Search
 USPC .................................... 29/744, 757; 438/120
 See application file for complete search history.

(56) References Cited

U.S. PATENT DOCUMENTS

| | | | |
|---|---|---|---|
| 7,926,176 | B2 | 4/2011 | Huber et al. |
| 2007/0056621 | A1 | 3/2007 | Baskaran |
| 2008/0057611 | A1 | 3/2008 | Stordeur et al. |

FOREIGN PATENT DOCUMENTS

| | | |
|---|---|---|
| CN | 1581529 | 2/2005 |
| TW | 200423443 | 11/2004 |
| TW | I281717 | 5/2007 |
| TW | I294404 | 3/2008 |

OTHER PUBLICATIONS

Fang et al, "Parallel micro component-to-substrate assembly with controlled poses and high surface coverage," Journal of Micromechanics and Microengineering 16, 2006, pp. 721-730.
Wang et al , "Template Based Assembly for Solid State Cooling," Proc. of IPACK2007 (ASME InterPACK '07), Jul. 8-12, 2007, pp. 1-3.
Chiou et al., "Multi-Step Three Dimensional Micro Assembly for a Flexible LED Display," IEEE 23rd International Conference on Micro Electro Mechanical Systems (MEMS), 2010, pp. 59-62.
Zheng et al., "Shape-and-solder-directed self-assembly to package semiconductor device segments," Applied Physics Letters 85(16), Oct. 18, 2004, pp. 3635-3637.
Lu et al., "Self-Assembly for Semiconductor Industry," IEEE Transactions on Semiconductor Manufacturing 20(4), Nov. 2007, pp. 421-431.

*Primary Examiner* — Cheung Lee
(74) *Attorney, Agent, or Firm* — Jianq Chyun IP Office (57) ABSTRACT

A self-assembly apparatus for assembling a plurality of devices with a predetermined aspect ratio is provided. The self-assembly apparatus includes a guiding element, a vibration device, and a magnetic field inducing device. The guiding element has a mesh structure. The vibration device is coupled to the guiding element and configured to vibrate the guiding element. The magnetic field inducing device is disposed below the guiding element and configured to generate a time-varying magnetic field to rotate each of the devices. Through a collective effect of the vibration of the guiding element, the time-varying magnetic field, and the self-gravity of each of the devices, the devices are positioned on a plate between the guiding element and the magnetic field inducing device through the mesh structure.

22 Claims, 10 Drawing Sheets

SELF-ASSEMBLY APPARATUS, DEVICE SELF-ASSEMBLING METHOD, AND METHOD OF ASSEMBLING THERMOELECTRIC DEVICES

CROSS-REFERENCE TO RELATED PATENT APPLICATION

This application claims the priority benefit of Taiwan application serial no. 101116702, filed on May 10, 2012. The entirety of the above-mentioned patent application is hereby incorporated by reference herein and made a part of this specification.

TECHNICAL FIELD

The disclosure relates to a self-assembly apparatus, and more particularly, to a self-assembly apparatus operated on the basis of a collective effect between magnetic field and gravitational field, a device self-assembling method, and a method of assembling thermoelectric devices.

BACKGROUND

Along with the microminiaturization of electronic devices, the technique of assembling a large number of miniature devices (for example, thermoelectric devices and light emitting diodes (LED)) on a substrate to form an integral module has attracted increasing attention. Particularly, a self-assembly technique is highly demanded.

Figure 1:
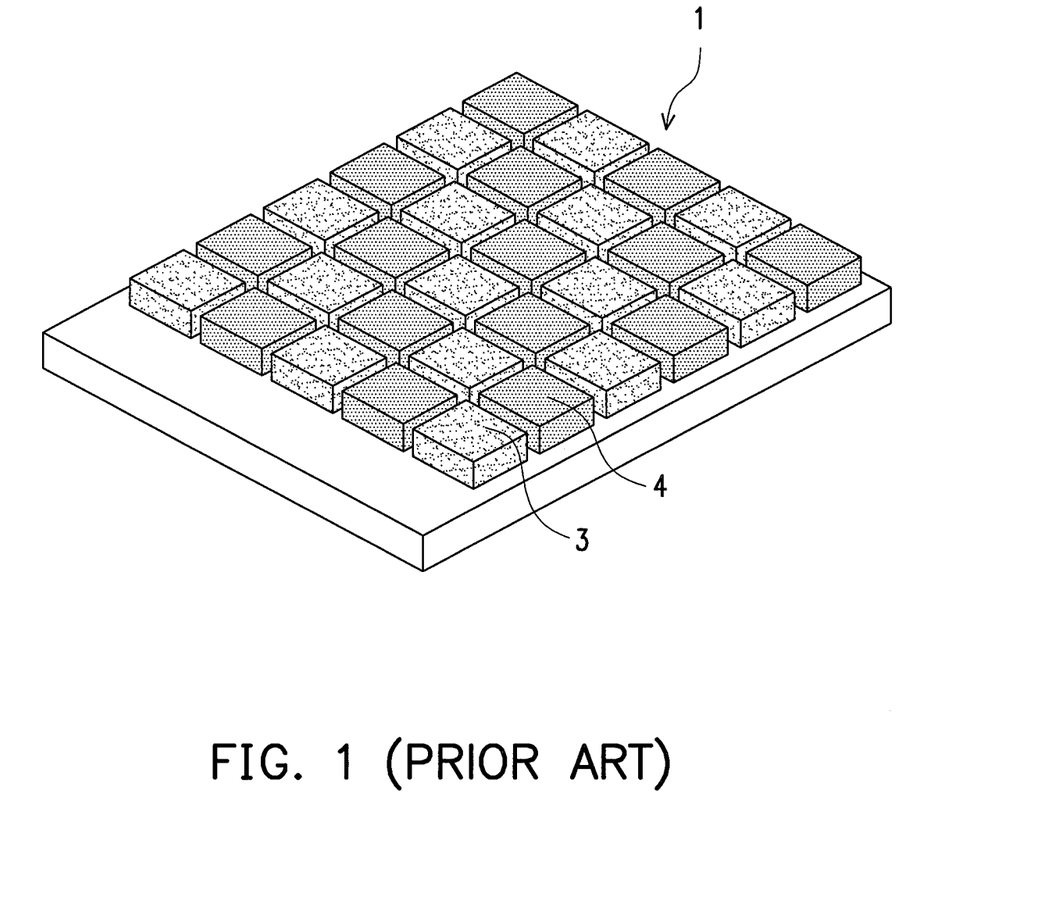
FIG. 1 is a diagram of a conventional thermoelectric module.

On the other hand, energy recycling has become one of the most important global issues due to petroleum crisis and global warming. Among all energy recycling techniques, thermoelectric devices which convert temperature differences to electric voltages can be used for recycling energy such as waste heat produced by boilers or waste heat in our daily life, and therefore are considered a new technique with great potential. FIG. 1 is a perspective view of a thermoelectric module. The thermoelectric module 1 is constructed by assembling a large number of p-type thermoelectric devices 3 and n-type thermoelectric devices 4. Some conventional self-assembly techniques assist the assembly through liquid surface tension. Besides, some other self-assembly techniques even require the shapes or surfaces of the devices to be specially processed.

Several existing device self-assembly methods will be listed below.

A method and an apparatus for aligning and assembling micro-devices are provided. The method includes providing a carrier having a plurality of joints and forming a coating over the joints. In this patented technique, the micro-devices are automatically aligned by using droplets.

An apparatus and a method of positioning a micro-device on a substrate are also provided. In this technique, the micro-device is moved to a convex structure formed on the substrate through the surface tension of a droplet.

A method of aligning and assembling thin-film thermoelectric devices is further provided. In this technique, a lubricant containing carbohydrate is formed on joints of a substrate, and micro-devices are automatically aligned through the hydrophilic and hydrophobic characteristics of the lubricant and the carbohydrate.

SUMMARY

The disclosure provides a self-assembly apparatus for assembling a plurality of devices with a predetermined aspect ratio. The self-assembly apparatus includes a guiding element, a vibration device, and a magnetic field inducing device. The guiding element has a mesh structure. The vibration device is connected with the guiding element and configured to vibrate the guiding element. The magnetic field inducing device is disposed below the guiding element and configured to generate a time-varying magnetic field to rotate each of the devices. Through a collective effect of the vibration of the guiding element, the time-varying magnetic field, and the self-gravity of each of the devices, the devices are positioned on a plate between the guiding element and magnetic field inducing device through the mesh structure.

The disclosure provides a device self-assembling method including following steps. First, a plurality of devices is placed on a guiding element, wherein the guiding element has a mesh structure. Then, the guiding element is vibrated. Next, a time-varying magnetic field is applied to the devices to rotate each of the devices. Through a collective effect of the vibration of the guiding element, the time-varying magnetic field, and the self-gravity of each of the devices, the devices are positioned on a plate below the guiding element through the mesh structure.

The disclosure provides a method of assembling thermoelectric devices. The method includes following steps. A plurality of p-type thermoelectric devices having magnetic conductive electrodes is placed on a first guiding element, wherein the first guiding element has a first mesh structure. The first guiding element is vibrated, and a first time-varying magnetic field is applied to the p-type thermoelectric devices to rotate each of the p-type thermoelectric devices. Through a collective effect of the vibration of the first guiding element, the first time-varying magnetic field, and the self-gravity of each of the p-type thermoelectric devices, the p-type thermoelectric devices are positioned on a plate through the first mesh structure. A plurality of n-type thermoelectric devices having magnetic conductive electrodes is placed on a second guiding element, wherein the second guiding element has a second mesh structure. The second guiding element is vibrated, and a second time-varying magnetic field is applied to the n-type thermoelectric devices to rotate each of the n-type thermoelectric devices. Through a collective effect of the vibration of the second guiding element, the second time-varying magnetic field, and the self-gravity of each of the n-type thermoelectric devices, the n-type thermoelectric devices are positioned on the plate through the second mesh structure. Herein the p-type thermoelectric devices and the n-type thermoelectric devices are alternatively disposed on the plate.

The disclosure provides a method of assembling thermoelectric devices. The method includes following steps. A plurality of p-type thermoelectric devices is placed on a first guiding element, wherein the first guiding element has a first mesh structure. The first guiding element is vibrated, and a first time-varying magnetic field is applied to the p-type thermoelectric devices to rotate each of the p-type thermoelectric devices. Through a collective effect of the vibration of the first guiding element, the first time-varying magnetic field, and the self-gravity of each of the p-type thermoelectric devices, the p-type thermoelectric devices are positioned on a first plate below the first guiding element through the first mesh structure. A plurality of n-type thermoelectric devices is placed on a second guiding element, wherein the second guiding element has a second mesh structure. The second guiding element is vibrated, and a second time-varying magnetic field is applied to the n-type thermoelectric devices to rotate each of the n-type thermoelectric devices. Through a collective effect of the vibration of the second guiding element, the second time-varying magnetic field, and the self-gravity of each of the n-type thermoelectric devices, the n-type thermoelectric devices are positioned on a second plate through the second mesh structure. After that, the first plate and the second plate are assembled so that the p-type thermoelectric devices and the n-type thermoelectric devices are located between the first plate and the second plate and are alternatively disposed.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 2A:
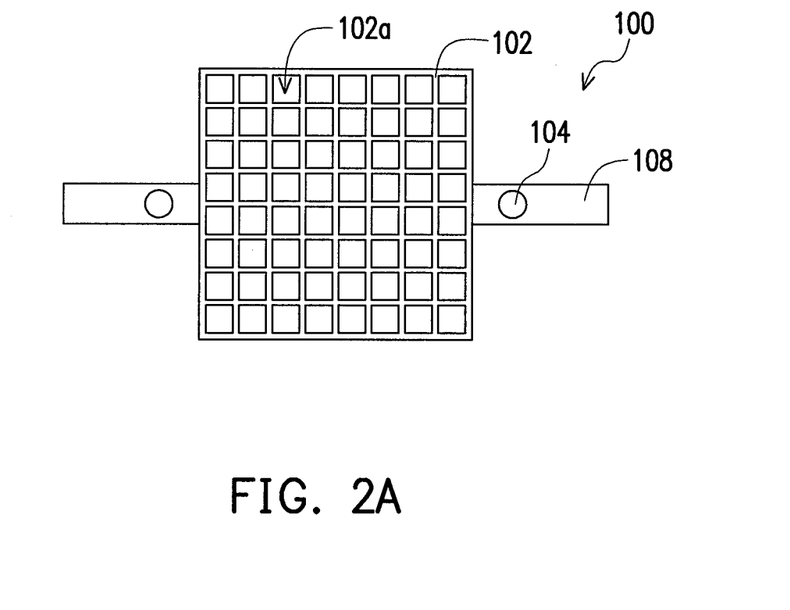
FIG. 2A is a top view of a self-assembly apparatus according to the first embodiment.
Figure 2B:
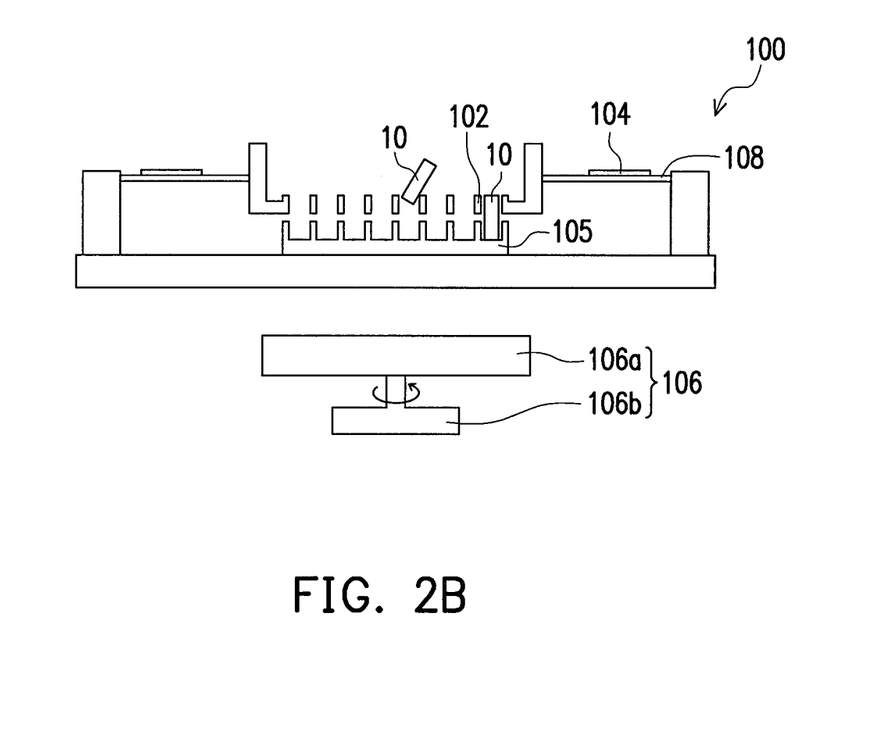
FIG. 2B is a cross-sectional view of the self-assembly apparatus in FIG. 2A.

FIG. 2A and FIG. 2B are respectively a top view and a cross-sectional view of a self-assembly apparatus according to the first embodiment of the disclosure.

Referring to FIG. 2A and FIG. 2B, the self-assembly apparatus 100 includes a guiding element 102, a vibration device 104, and a magnetic field inducing device 106. The guiding element 102 has a mesh structure. The vibration device 104 is coupled to the guiding element 102 and configured to vibrate the guiding element 102. The magnetic field inducing device 106 is disposed below the guiding element 102 and configured to generate a time-varying magnetic field. As shown in FIG. 2B, if a device 10 is placed on the guiding element 102, through a collective effect of the vibration of the guiding element 102, the time-varying magnetic field, and the self-gravity of device 10, the device 10 is positioned on a plate 105 between the guiding element 102 and the magnetic field inducing device 106 through the mesh structure of the guiding element 102. FIG. 2B illustrates both a positioned device 10 and a device 10 that is not yet positioned. The positioning mechanism will be explained in detail later on.

In the first embodiment, the guiding element 102 is a board-shaped element, and the mesh structure thereof may be constructed by forming a plurality of apertures 102a that is arranged into an array on the board-shaped element through lithography, electrochemical discharge machining, laser machining, or CNC precision machining.

Figure 2C:
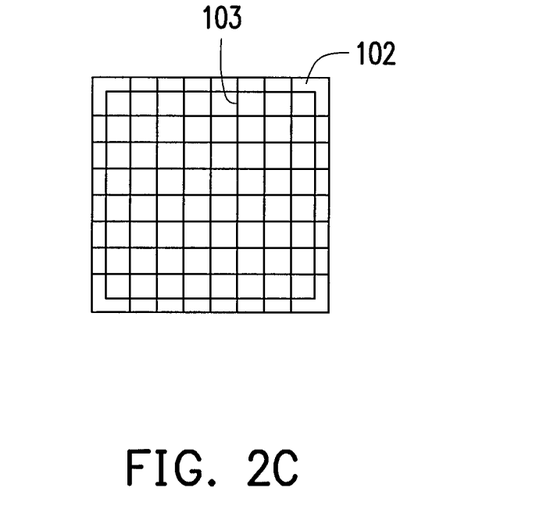
FIG. 2C is a top view of another self-assembly apparatus according to the first embodiment.
Figure 2D:
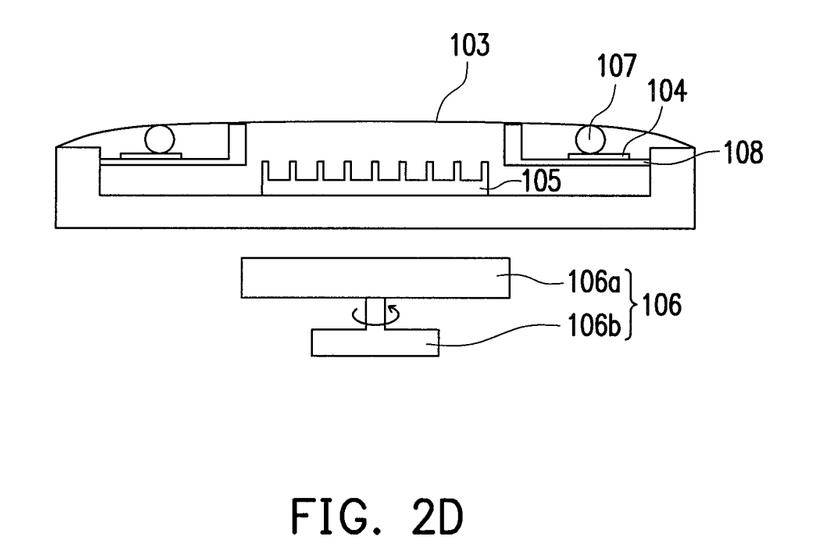
FIG. 2D is a side view of the self-assembly apparatus in FIG. 2C.

In the first embodiment, the material of the guiding element 102 is non-metal material, such as SU8, PET, or PI. However, the disclosure is not limited thereto, and in other embodiments, the material of the guiding element 102 may also be metal material. Additionally, the method of forming the mesh structure is not limited to those mentioned above, and in other implementations of the first embodiment, the mesh structure of the guiding element 102 may also be constructed by weaving a plurality of mesh wires 103 into a network. FIG. 2C and FIG. 2D are respectively a top view and a cross-sectional view of such a mesh structure. To be specific, referring to FIG. 2D, a spacer 107 is disposed on the vibration device 104, and the mesh wires 103 are set up on the spacer 107, so that the mesh wires 103 can be vibrated by the vibration device 104.

Referring to FIG. 2A and FIG. 2B, in the first embodiment, the vibration device 104 is a vibrating reed installed on a bracket 108, and which is connected with the guiding element 102 via the bracket 108. The vibrating reed may be made of a piezoelectric material or may be a buzzer. Thereby, the vibrating reed may be made to vibrate by applying an AC voltage thereon.

The magnetic field inducing device 106 is below the plate 105 and configured to generate a time-varying magnetic field. To be specific, in the first embodiment, the magnetic field inducing device 106 includes a magnet 106a and a motor 106b. The magnet 106a may be in a strip shape, and the north and south poles are located at both ends of the magnet 106a. The motor 106b rotates the magnet 106a, and the induced magnetic field has a time-varying magnetic direction. The rotation direction of the magnet 106a is as indicated by the curved arrows in the drawings. However, the shape of the magnet 106a is not limited herein, and it is within the scope of the disclosure as long as a time-varying magnetic field can be induced when the magnet 106a is rotated.

By using the self-assembly apparatus described above, the devices can be positioned on the plate through the mesh structure of the guiding element. Hereinafter, this self-assembly mechanism will be explained in detail with reference to accompanying drawings. For the convenience of description, only those devices required by the description of the self-assembly mechanism are illustrated.

Figure 3A:
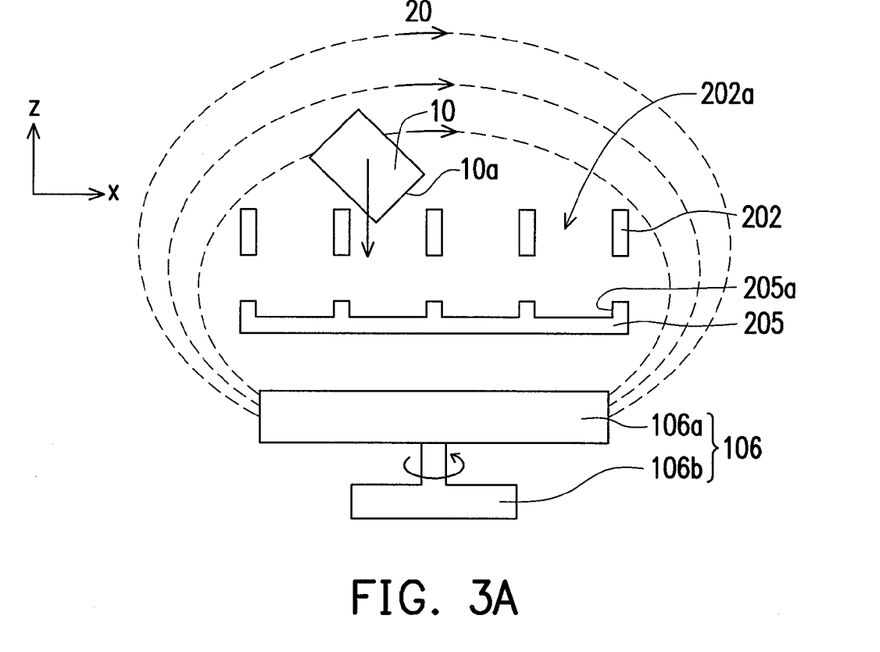
FIGS. 3A-3C are diagrams illustrating a device self-assembling method according to the second embodiment.
Figure 3B:
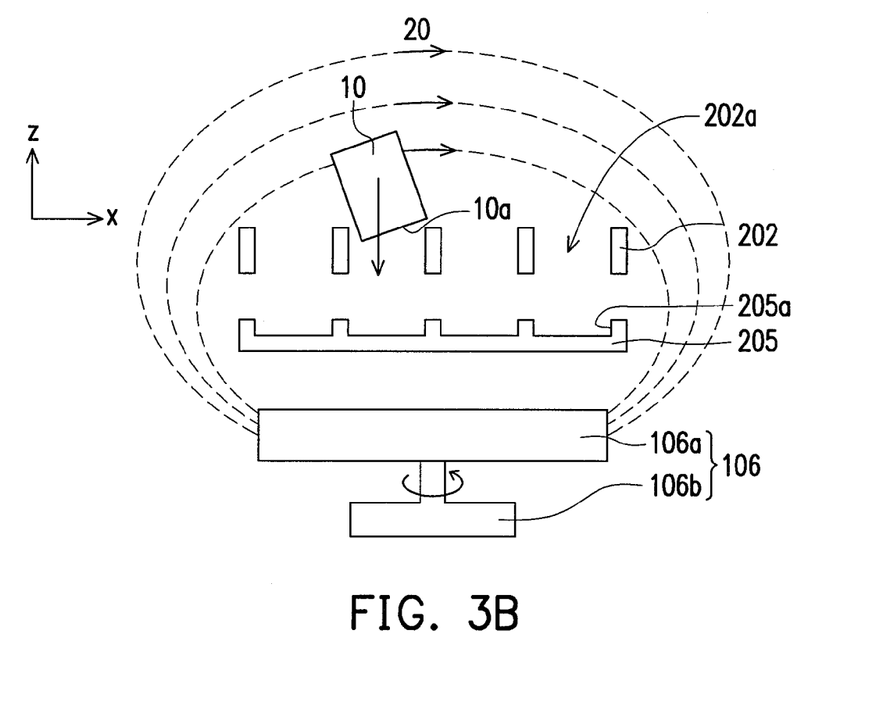
Figure 3C:
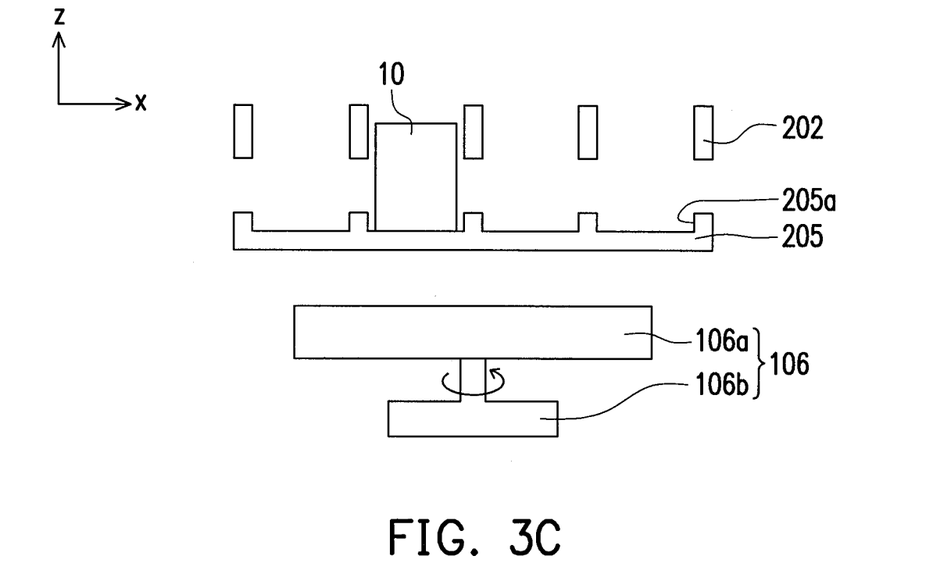

FIGS. 3A-3C are diagrams illustrating a device self-assembling method according to the second embodiment.

Referring to FIGS. 3A-3C, the device self-assembling method of the second embodiment includes following steps. First, a device 10 is placed on a guiding element 202. Herein the guiding element 202 has a mesh structure (for example, a mesh structure same as that described in the first embodiment). Then, the guiding element 102 is vibrated. Taking the self-assembly apparatus 100 in the first embodiment as an example, a sinusoidal voltage is applied to the vibrating reed to vibrate the bracket 108 and the guiding element 102. Besides the frequency and the level of the sinusoidal voltage, the vibration amplitude is also related to the elastic coefficient and the mass of the bracket 108. For example, a sinusoidal voltage of 640 Hz and 5 V allows the guiding element to vibrate with an amplitude of 19 μm; a sinusoidal voltage of 640 Hz and 3 V allows the guiding element to vibrate with an amplitude of 12 μm; and a sinusoidal voltage of 800 Hz and 5 V allows the guiding element to vibrate with an amplitude of 9 p.m.

However, the frequency and voltage levels are not limited to aforementioned values, and it is within the scope of the disclosure as long as the vibration results in a near elastic collision between the device 10 and the guiding element 202 and the device 10 slightly moves on the guiding element 202 but does not leave the guiding element 202. For example, in other embodiments, the frequency may be between 600 Hz and 1600 Hz, the voltage may be between 0.6 V and 1.8 V, and the vibration amplitude may be between 6 μm and 20 μm. Or, in more embodiments, the vibration amplitude of the guiding element 102 increases with the size and weight of the device 10 and may reach 20 μm or even more.

Figure 3D:
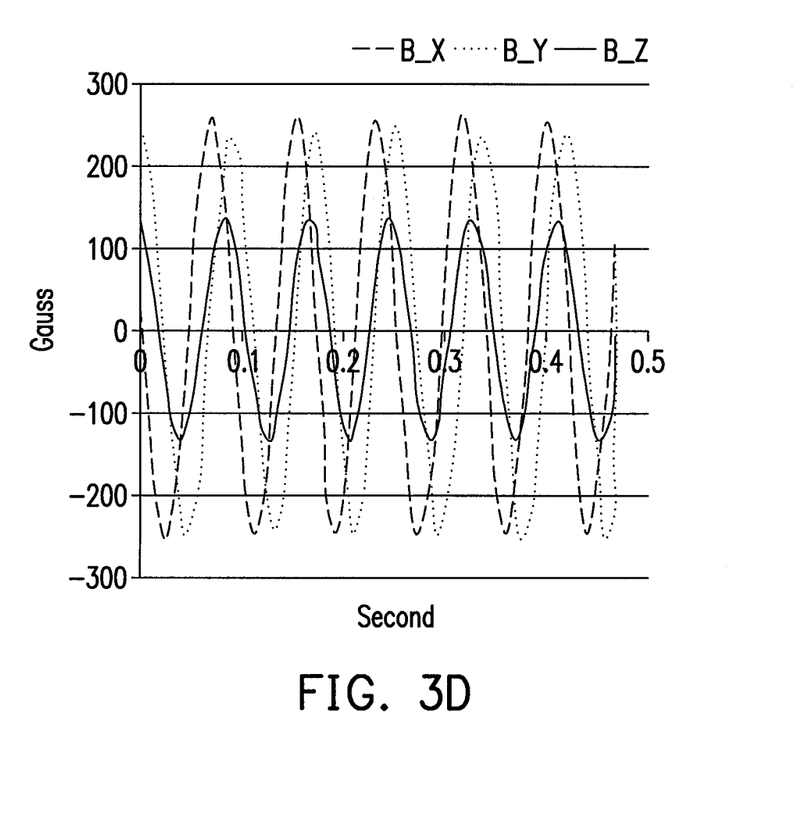
FIG. 3D is a diagram showing the magnetic field intensity as a function of time according to the second embodiment, in which variations of the magnetic field intensity in three spatial dimensions are illustrated.

Thereafter, a time-varying magnetic field 20 is applied to the device 10 to rotate the device 10. The time-varying magnetic field 20 may be generated by using the magnetic field inducing device 106 described in the first embodiment, wherein the magnet 106a rotates at a rate of 720 rpm. The variation of the intensity of the time-varying magnetic field 20 in the three spatial dimensions can be detected by using a Hall sensor. FIG. 3D illustrates the magnetic field intensity as a function of time according to the second embodiment. In FIG. 3D, $B\_x$, $B\_y$, and $B\_z$ respectively represent the components of the magnetic field intensity on the axes x, y, and z, wherein the directions of the axes x and z are as shown in FIGS. 3A-3C, and the axis y is directed perpendicularly into the plane of paper in FIGS. 3A-3C. Part of the magnetic lines of force of the time-varying magnetic field at a specific instance is as indicated by the dotted lines in FIGS. 3A-3C.

As shown in FIG. 3A and FIG. 3B, after a device 10 is placed on the guiding element 202, the device 10 slightly moves on the guiding element 202 due to the vibration of the guiding element 202. Meanwhile, the time-varying magnetic field 20 causes the device 10 to rotate. When the device 10 moves to an appropriate position (for example, a face 10a of the device 10 is aligned with an aperture 202a of the mesh structure), the device 10 passes through the mesh structure under the effect of its self-gravity (the direction thereof is indicated by the solid arrows in FIG. 3A and FIG. 3B) and is positioned on the plate 205. A plurality of indentations 205a suitable for accommodating the devices 10 may be formed on the plate 205 in advance to assist the positioning of the devices 10. Obviously, if a specific indentation 205a already accommodates a device 10, any other device 10 above the indentation 205a can be taken away under the collective effect of the vibration of the guiding element and the time-varying magnetic field. In addition, as shown in FIG. 3C, the size of each indentation 205a is slightly greater than that of each device 10. Thus, after the devices 10 are positioned on the plate 205 through the mesh structure, the plate 205 can be tilted so that the devices 10 lean against the corners of the indentations 205a and accordingly a more precise alignment is achieved.

The device self-assembling method described above can be adopted for assembling different devices. For example, in a thermoelectric power generating application, a plurality of thermoelectric devices is assembled into a thermoelectric module to increase the electric output. The electrodes of the thermoelectric devices usually contain some magnetic conductive ingredients (for example, iron or nickel). Thus, the device self-assembling method provided by the disclosure is applicable. Below, a method of assembling thermoelectric devices will be further explained.

First, the movement of a thermoelectric device 10 having a magnetic conductive electrode 10b in a time-varying magnetic field will be explained with reference to FIGS. 4A-4D.

Figure 4A:
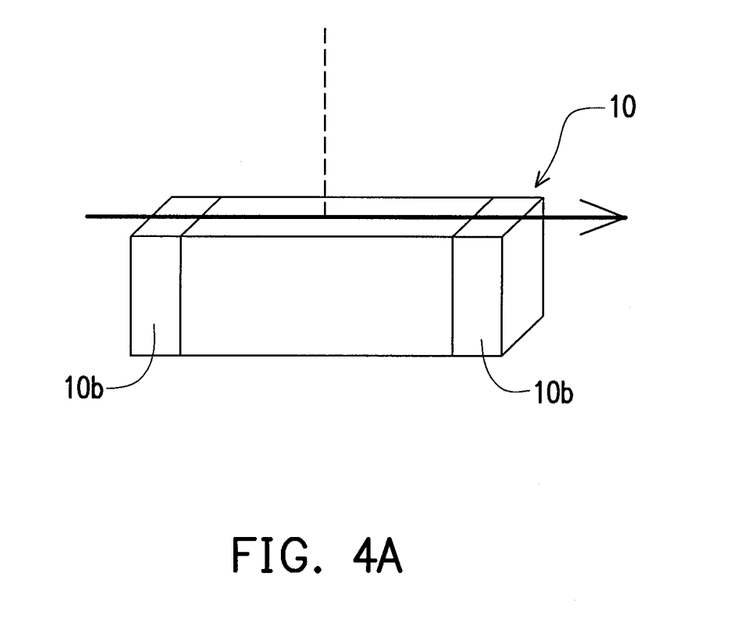
FIGS. 4A-4D are diagrams showing the effect of a magnetic field on thermoelectric devices having magnetic conductive electrodes.
Figure 4B:
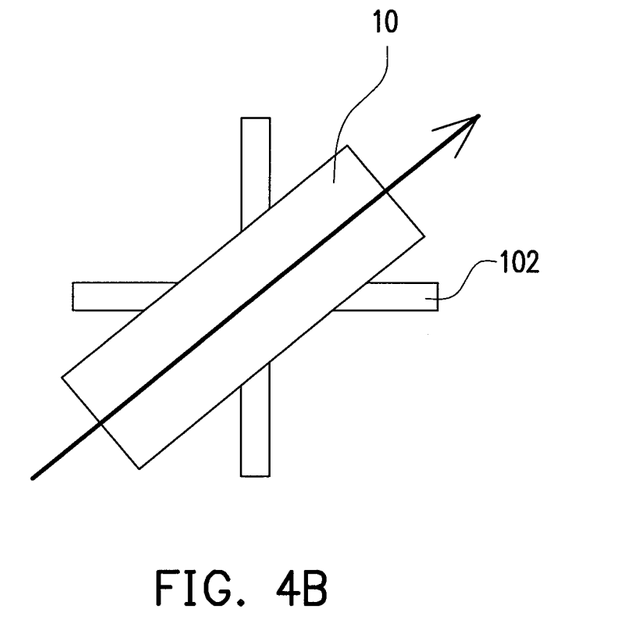
Figure 4C:
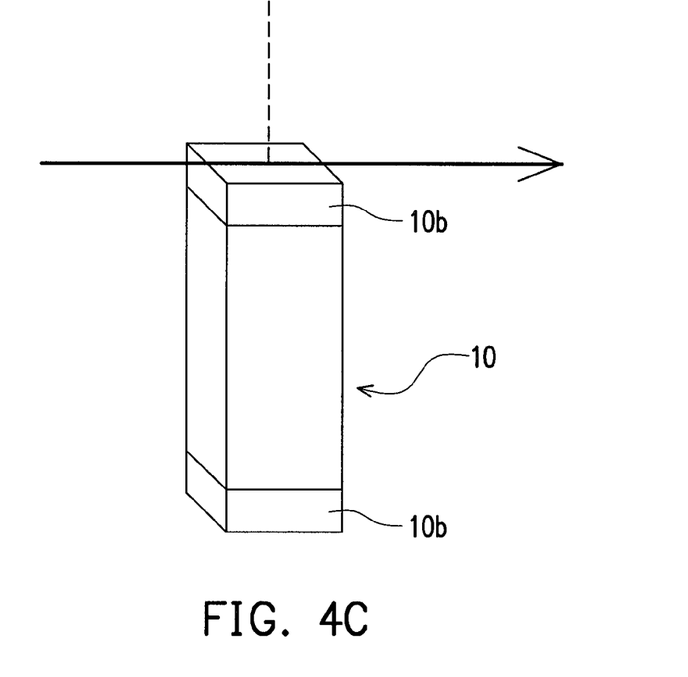
Figure 4D:
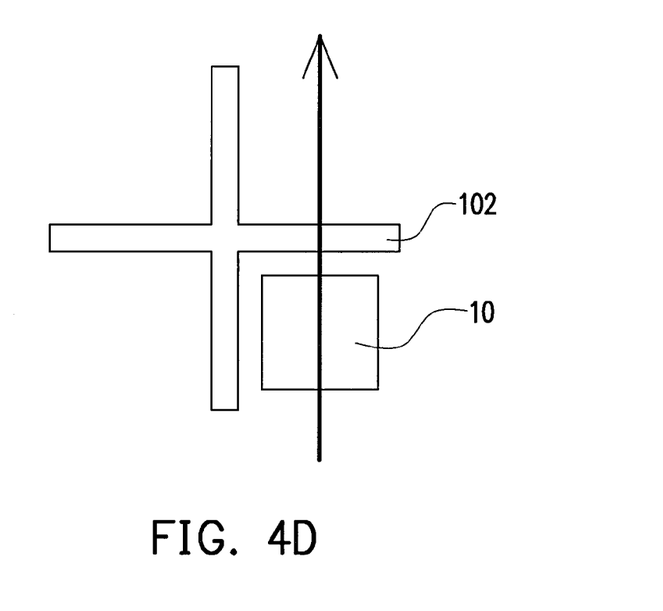

FIG. 4A and FIG. 4C are diagrams of the thermoelectric device 10 in the time-varying magnetic field. FIG. 4B and FIG. 4D are respectively top views of FIG. 4A and FIG. 4C. In FIG. 4A and FIG. 4C, the dotted line extends in a direction parallel to axis z in FIGS. 3A-3C. The direction indicated by the arrows in FIGS. 4A-4D is the transient magnetic field direction.

In the state illustrated in FIG. 4A and FIG. 4B, the thermoelectric device 10 is on the guiding element 102, and the relationship between the normal vector of the electrode surface and the magnetic direction changes with time. Herein the magnetic field produces a magnetic moment on the magnetic conductive electrode 10b, and the thermoelectric device 10 rotates under the effect of the magnetic moment. When the thermoelectric device 10 rotates to the state illustrated in FIG. 4C and FIG. 4D, it may pass through the guiding element 102. Herein because the magnetic direction is parallel to the electrode surface, the thermoelectric device 10 stops rotating.

FIGS. 5A-5E are flowcharts of a method of assembling thermoelectric devices according to the third embodiment.

Figure 5A:
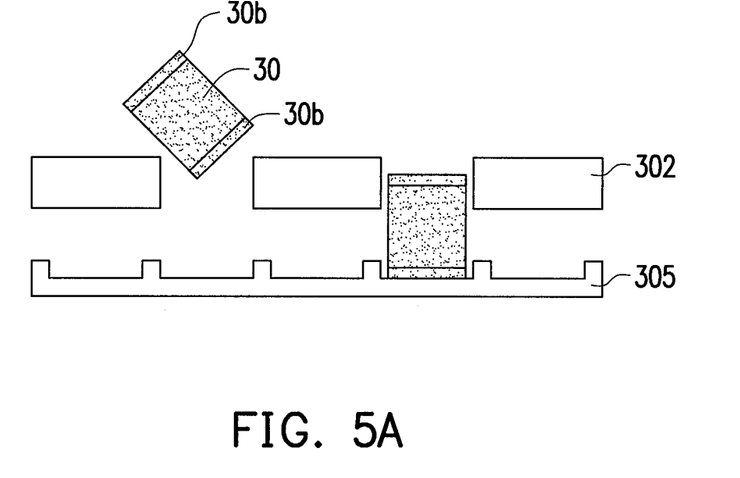
FIGS. 5A-5E are flowcharts of a method of assembling thermoelectric devices according to the third embodiment.

According to the third embodiment, the method of assembling thermoelectric devices includes following steps. As shown in FIG. 5A, a plurality of p-type thermoelectric devices 30 is placed on a first guiding element 302. Each p-type thermoelectric device 30 has two magnetic conductive electrodes 30b that are disposed opposite to each other. The first guiding element 302 has a first mesh structure, and the formation of the first mesh structure can be referred to the first embodiment and therefore will not be described herein.

Then, the first guiding element 302 is vibrated, and a first time-varying magnetic field is applied to the p-type thermoelectric devices 30, so as to rotate each of the p-type thermoelectric devices 30. Through a collective effect of the vibration of the first guiding element 302, the first time-varying magnetic field, and the self-gravity of each p-type thermoelectric device 30, the p-type thermoelectric devices 30 are positioned on a first plate 305 through the first mesh structure.

Figure 5B:
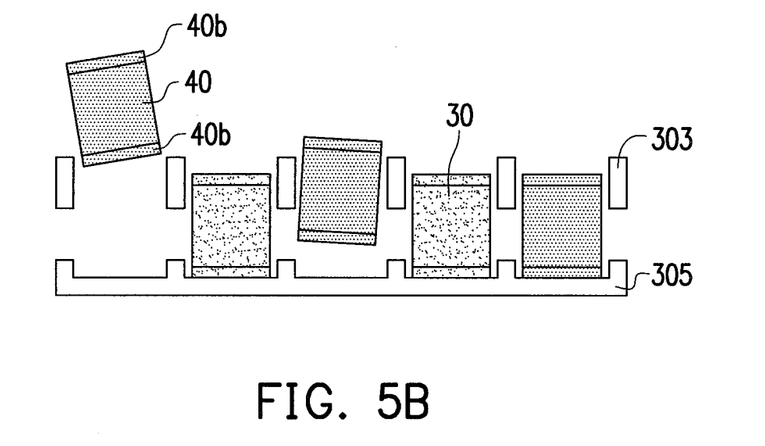

Next, as shown in FIG. 5B, a plurality of n-type thermoelectric devices 40 is placed on a second guiding element 303. Each n-type thermoelectric device 40 has two magnetic conductive electrodes 40b that are disposed opposite to each other. The second guiding element 303 has a second mesh structure, and the formation of the second mesh structure can also be referred to the first embodiment.

Figure 5C:
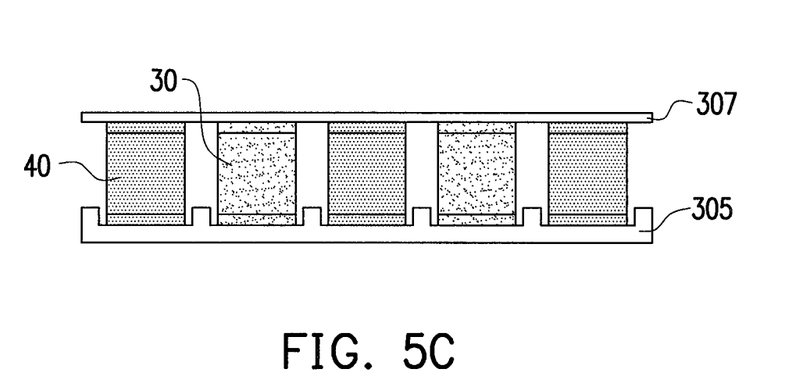
Figure 5D:
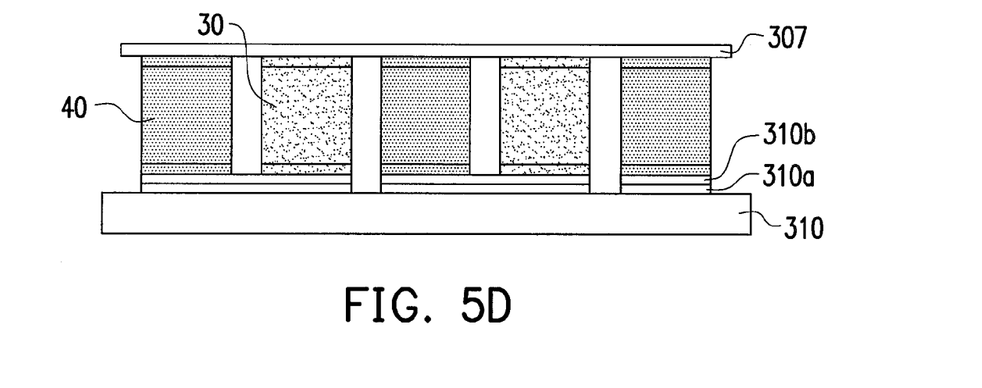
Figure 5E:
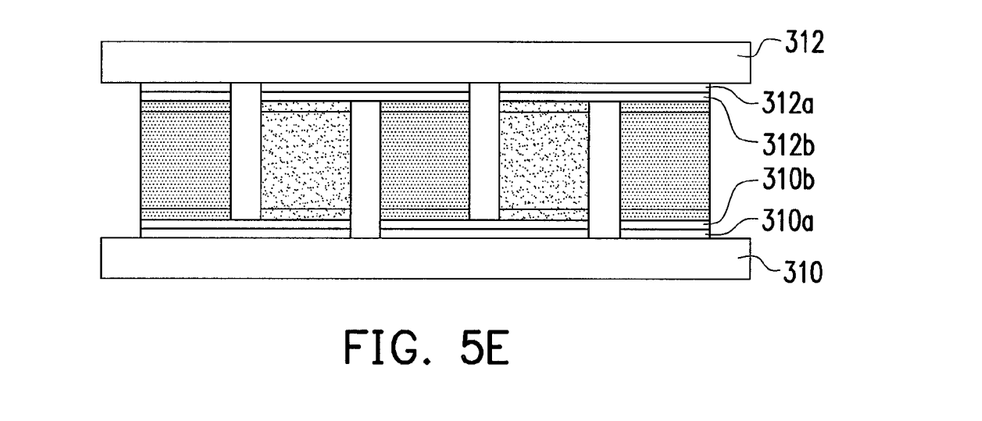
Figure 5F:
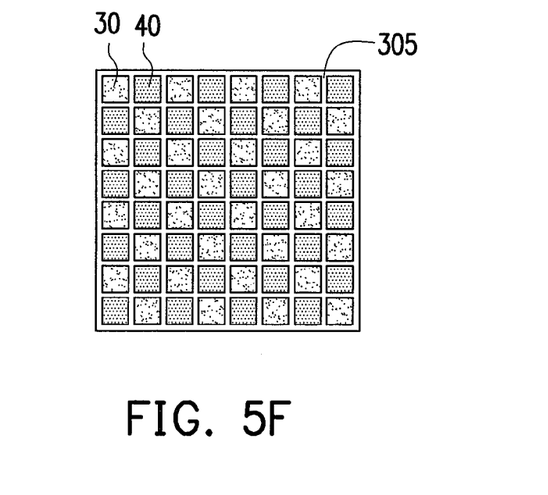
FIG. 5F is a diagram illustrating the arrangement of p-type thermoelectric devices and n-type thermoelectric devices in a thermoelectric module.

Thereafter, the second guiding element 303 is vibrated, and a second time-varying magnetic field is applied to the n-type thermoelectric devices 40, so as to rotate each of the n-type thermoelectric devices 40. Through a collective effect of the second guiding element 303, the second time-varying magnetic field, and the self-gravity of each n-type thermoelectric device 40, the n-type thermoelectric devices 40 are positioned on a plate 305 through the second mesh structure. Herein the p-type thermoelectric devices 30 and the n-type thermoelectric devices 40 are alternatively disposed on the plate 305, as shown in FIG. 5F.

The technique of vibrating the first guiding element 302 and the second guiding element 303 and the technique of generating the first time-varying magnetic field and the second time-varying magnetic field can be referred to the second embodiment and therefore will not be described herein.

According to the third embodiment, the method of assembling thermoelectric devices may further include moving the p-type thermoelectric devices 30 and the n-type thermoelectric devices 40 from the plate 305 to substrates of the thermoelectric module.

Below, the method of moving the p-type thermoelectric devices 30 and the n-type thermoelectric devices 40 from the plate 305 to the substrate of the thermoelectric module will be described with reference to FIG. 5C and FIG. 5D. First, an adhesive tape 307 is pasted onto the p-type thermoelectric devices 30 and the n-type thermoelectric devices 40. Then, the thermoelectric devices are removed from the plate 305 and moved to a first substrate 310. Because the thermoelectric devices are adhered on the adhesive tape 307, the original arrangement of the thermoelectric devices is retained after the thermoelectric devices are moved to the first substrate 310. In addition, an electrode 310a and a conductive paste 310b (for example, solder paste) are formed on the first substrate 310 in advance at the position corresponding to a pair of thermoelectric devices 30 and 40, wherein the conductive paste 310b is used for adhering the thermoelectric devices. Thereafter, the adhesive tape 307 is stripped. A second substrate 312 is provided, and an electrode 312a and a conductive paste 312b (for example, solder paste) are formed on the second substrate 312 in advance at the position corresponding to a pair of thermoelectric devices 30 and 40. After that, the thermoelectric devices are bonded with the second substrate 312 so that the thermoelectric devices are located between the first substrate 310 and the second substrate 312 and the p-type thermoelectric devices and the n-type thermoelectric devices are alternatively disposed. Here the assembly of the thermoelectric devices is completed. However, the technique of moving the p-type thermoelectric devices 30 and the n-type thermoelectric devices 40 from the plate 305 to the substrates of the thermoelectric module is not limited to that described above, and in other embodiments, the p-type thermoelectric devices 30 and the n-type thermoelectric devices 40 may also be fixed on the plate 305 through absorption and then moved to the substrates of the thermoelectric module.

In other implementations of the third embodiment, the p-type thermoelectric devices 30 are directly positioned on the first substrate 310 by using the first guiding element 302; the n-type thermoelectric devices 40 are directly positioned on the first substrate 310 by using the second guiding element 303; and the second substrate 312 is then bonded to the thermoelectric devices to complete the assembly of the thermoelectric devices.

Figure 6A:
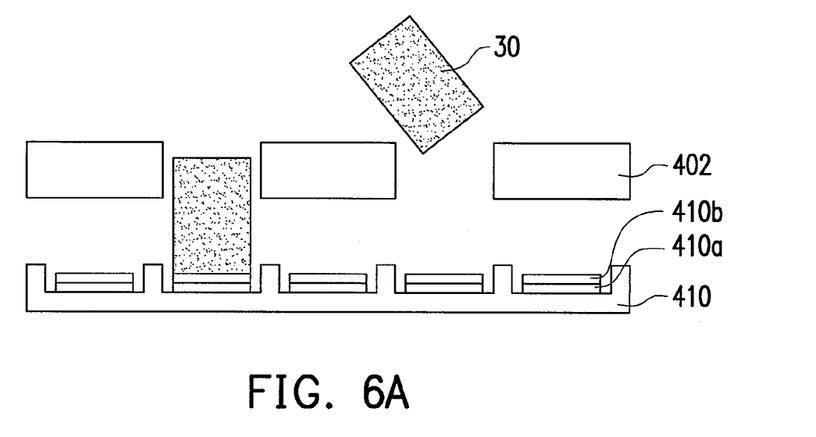
FIGS. 6A-6C are flowcharts of a method of assembling thermoelectric devices according to the fourth exemplary embodiment.
Figure 6B:
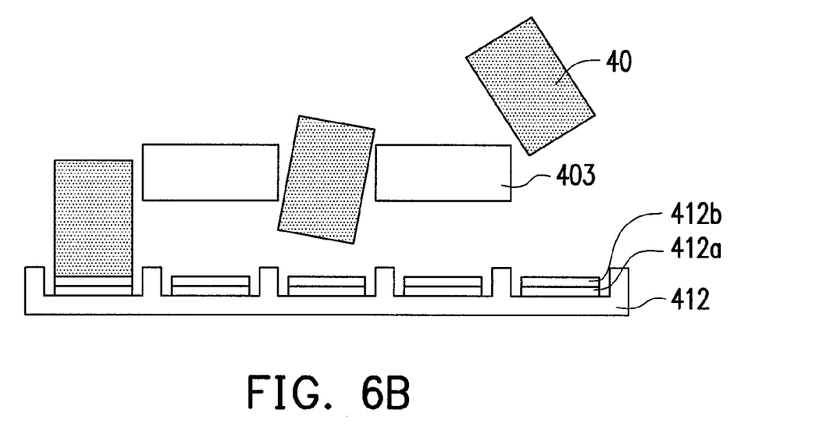
Figure 6C:
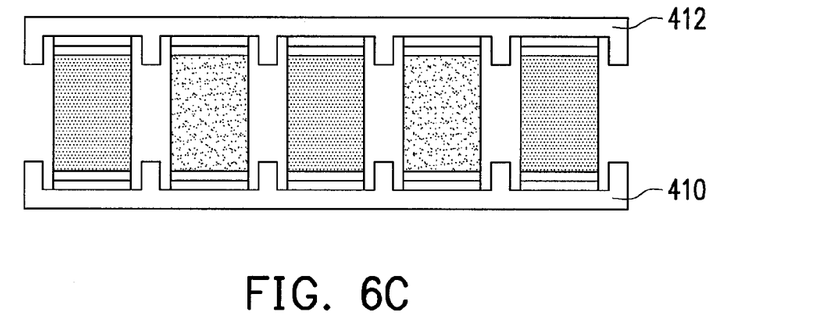

FIGS. 6A-6C are flowcharts of a method of assembling thermoelectric devices according to the fourth embodiment.

Referring to FIGS. 6A-6C, the method of assembling thermoelectric device of the fourth embodiment includes following steps. A plurality of p-type thermoelectric devices 30 is positioned on a first plate 410 by using a first guiding element 402. A plurality of n-type thermoelectric devices 40 is positioned on a second plate 412 by using a second guiding element 403. The first plate 410 and the second plate 412 may be substrates of a thermoelectric module, and electrodes 410a and 412a and conductive pastes (for example, solder pastes) 410b and 412b may be formed thereon in advance. The technique of positioning the thermoelectric devices by using the guiding elements has been described in foregoing second embodiment and third embodiment and therefore will not be described herein.

Then, the first plate 410 and the second plate 412 are assembled so that the p-type thermoelectric devices 30 and the n-type thermoelectric devices 40 are located between the first plate 410 and the second plate 412 and alternatively disposed (as shown in FIG. 5F). Here the assembly of the thermoelectric devices is completed.

In the third embodiment and the fourth embodiment described above, the p-type thermoelectric devices and then the n-type thermoelectric devices are positioned. However, such a sequence is only an example, and the sequence of positioning the p-type thermoelectric devices and the n-type thermoelectric devices is not limited in the disclosure.

The self-assembly apparatus, the device self-assembling method, or the method of assembling thermoelectric devices provided by the disclosure is particularly suitable for devices with an aspect ratio greater than 1. For example, if a mesh of the mesh structure is designed to match the smallest face of a rectangular device, the rectangular device can only pass through the mesh in a specific direction. However, the disclosure is also suitable for devices with an aspect ratio equal to or smaller than 1.

As described above, in the self-assembly apparatus, the device self-assembling method, and the method of assembling thermoelectric devices provided by the disclosure, devices are sorted or assembled under a collective effect of vibration, magnetic field, and gravity. If the technique in the disclosure is only used for sorting thermoelectric devices, the devices can be assembled through a pick and place technique. Thereby, the assembly time is greatly shortened (for example, within 10 seconds), and parallel mass assembly of a large area can be realized. Moreover, no surface processing is required on the devices to be assembled, and no solution is used during the assembly procedure. Furthermore, the guiding elements can be repeated used. Thereby, the cost is reduced, the production efficiency is improved, and damage caused by mechanically clamping and picking the devices or by the humid environment is avoided.

Additionally, p- and n-type thermoelectric devices have similar appearances and cannot be easily distinguished. Thus, the electrodes of the thermoelectric devices can be dyed to facilitate the assembly process and identity defective products (for example, those of thermoelectric devices that split during the vibration) conveniently. For example, the devices can be dyed through gold emersion so that the devices can be easily identified and distinguished. Because the devices are metal-plated and the electrodes thereof reflect light, the sorted and assembled devices can be inspected through an automatic optical inspection (AOI) technique and an image recognition technique.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A self-assembly apparatus for assembling a plurality of devices with a predetermined aspect ratio, the self-assembly apparatus comprising:
a guiding element having a mesh structure;
a vibration device connected with the guiding element and configured to vibrate the guiding element; and
a magnetic field inducing device disposed below the guiding element and configured to generate a time-varying magnetic field to rotate the plurality of devices,
wherein through a collective effect of the vibration of the guiding element, the time-varying magnetic field, and a self-gravity of each of the plurality of devices, the plurality of devices are positioned on a plate between the guiding element and the magnetic field inducing device through the mesh structure.

2. The self-assembly apparatus according to claim 1, wherein the guiding element is a board-shaped element.

3. The self-assembly apparatus according to claim 2, wherein the board-shaped element comprises metal.

4. The self-assembly apparatus according to claim 2, wherein the board-shaped element comprises non-metal.

5. The self-assembly apparatus according to claim 4, wherein the board-shaped element comprises SU8, PET, or PI.

6. The self-assembly apparatus according to claim 2, wherein the mesh structure is formed by lithography, electrochemical discharge machining, laser machining, or CNC precision machining.

7. The self-assembly apparatus according to claim 1, wherein the mesh structure of the guiding element is formed by weaving a plurality of mesh wires.

8. The self-assembly apparatus according to claim 1, wherein the magnetic field inducing device comprises:
a magnet; and
a motor configured to rotate the magnet.

9. The self-assembly apparatus according to claim 1, wherein the plate has a plurality of indentations, and each of the plurality of indentations is suitable for accommodating each of the plurality of devices.

10. The self-assembly apparatus according to claim 1, wherein the predetermined aspect ratio is greater than 1.

11. The self-assembly apparatus according to claim 1, wherein the plurality of devices are thermoelectric devices each comprising a magnetic conductive electrode.

12. The self-assembly apparatus according to claim 11, wherein the plate is a substrate of a thermoelectric module, and a plurality of electrodes corresponding to the mesh structure is formed on the substrate.

13. A device self-assembling method, comprising:
placing a plurality of devices on a guiding element, wherein the guiding element has a mesh structure;
vibrating the guiding element;
applying a time-varying magnetic field to the plurality of devices to rotate each of the plurality of devices;
through a collective effect of the vibration of the guiding element, the time-varying magnetic field, and a self-gravity of each of the plurality of devices, positioning the plurality of devices on a plate below the guiding element through the mesh structure.

14. The device self-assembling method according to claim 13, wherein the plate has a plurality of indentations, and each of the plurality of indentations is suitable for accommodating each of the plurality of devices; and
after positioning the plurality of devices on the plate through the mesh structure, the device self-assembling method further comprises:
tilting the plate so that the plurality of devices lean against to corners of the plurality of indentations.

15. The device self-assembling method according to claim 13, wherein a vibration amplitude of the guiding element is between 6 μm and 20 μm.

16. The device self-assembling method according to claim 15, wherein the guiding element is vibrated by applying a sinusoidal voltage having a frequency between 600 Hz and 1600 Hz and a voltage level between 0.6 V and 1.8 V on a vibration device coupled to the guiding element.

17. The device self-assembling method according to claim 13, wherein a vibration amplitude of the guiding element is greater than 20 μm.

18. A method of assembling thermoelectric devices, comprising:
placing a plurality of p-type thermoelectric devices each comprising a magnetic conductive electrode on a first guiding element, wherein the first guiding element has a first mesh structure;
vibrating the first guiding element;
applying a first time-varying magnetic field to the plurality of p-type thermoelectric devices to rotate each of the plurality of p-type thermoelectric devices;
through a collective effect of the vibration of the first guiding element, the first time-varying magnetic field, and a self-gravity of each of the plurality of p-type thermoelectric devices, positioning the plurality of p-type thermoelectric devices on a plate through the first mesh structure;
placing a plurality of n-type thermoelectric devices each comprising a magnetic conductive electrode on a second guiding element, wherein the second guiding element has a second mesh structure;
vibrating the second guiding element;
applying a second time-varying magnetic field to the plurality of n-type thermoelectric devices to rotate each of the plurality of n-type thermoelectric devices;
through a collective effect of the vibration of the second guiding element, the second time-varying magnetic field, and a self-gravity of each of the plurality of n-type thermoelectric devices, positioning the plurality of n-type thermoelectric devices on the plate through the second mesh structure,
wherein the plurality of p-type thermoelectric devices and the plurality of n-type thermoelectric devices are alternatively disposed on the plate.

19. The method of assembling thermoelectric devices according to claim 18, wherein the plate has a plurality of indentations, and each of the plurality of indentations is suitable for accommodating one of the plurality of n-type thermoelectric devices or one of the plurality of p-type thermoelectric devices; and
after the plurality of p-type thermoelectric devices are positioned on the plate through the first mesh structure and the plurality of n-type thermoelectric devices are positioned on the plate through the second mesh structure, the method of assembling thermoelectric devices further comprises:
tilting the plate so that the plurality of n-type thermoelectric devices and the plurality of p-type thermoelectric devices lean against corners of the plurality of indentations.

20. The method of assembling thermoelectric devices according to claim 18 further comprising moving the plurality of p-type thermoelectric devices and the plurality of n-type thermoelectric devices from the plate to a substrate.

21. A method of assembling thermoelectric devices, comprising:
placing a plurality of p-type thermoelectric devices each comprising a magnetic conductive electrode on a first guiding element, wherein the first guiding element has a first mesh structure;
vibrating the first guiding element;
applying a first time-varying magnetic field to the plurality of p-type thermoelectric devices to rotate each of the plurality of p-type thermoelectric devices;
through a collective effect of the vibration of the first guiding element, the first time-varying magnetic field, and a self-gravity of each of the plurality of p-type thermoelectric devices, positioning the plurality of p-type thermoelectric devices on a first plate below the first guiding element through the first mesh structure;

placing a plurality of n-type thermoelectric devices each comprising a magnetic conductive electrode on a second guiding element, wherein the second guiding element has a second mesh structure;

vibrating the second guiding element;

applying a second time-varying magnetic field to the plurality of n-type thermoelectric devices to rotate each of the plurality of n-type thermoelectric devices;

through a collective effect of the second guiding element, the second time-varying magnetic field and a self-gravity of each of the plurality of n-type thermoelectric devices, positioning the plurality of n-type thermoelectric devices on a second plate through the second mesh structure; and assembling the first plate and the second plate so that the plurality of p-type thermoelectric devices and the plurality of n-type thermoelectric devices are located between the first plate and the second plate, and the plurality of p-type thermoelectric devices and the plurality of n-type thermoelectric devices are alternatively disposed.

22. The method of assembling thermoelectric devices according to claim 21, wherein the first plate has a plurality of first indentations, and each of the plurality of first indentations is suitable for accommodating one of the plurality of p-type thermoelectric devices, the second plate has a plurality of second indentations, and each of the plurality of second indentations is suitable for accommodating one of the plurality of n-type thermoelectric devices; and after the plurality of p-type thermoelectric devices are positioned on the first plate through the first mesh structure and the plurality of n-type thermoelectric devices are positioned on the second plate through the second mesh structure, the method of assembling thermoelectric devices further comprises:

tilting the first plate so that the plurality of p-type thermoelectric devices lean against corners of the plurality of first indentations; and tilting the second plate so that the plurality of n-type thermoelectric devices lean against corners of the plurality of second indentations.

* * * * *